United States Patent [19]

Yeh

[11] Patent Number: 5,348,489
[45] Date of Patent: Sep. 20, 1994

[54] SOCKET ASSEMBLY FOR AN INTEGRATED CIRCUIT CHIP

[75] Inventor: Saint Yeh, Taipei, Taiwan

[73] Assignee: Nextronics Engineering Co., Ltd., Taipei, Taiwan

[21] Appl. No.: 149,281

[22] Filed: Nov. 9, 1993

[51] Int. Cl.⁵ .............................................. H01R 13/62
[52] U.S. Cl. ..................................... 439/153; 439/159
[58] Field of Search .................................. 439/152–160, 439/372

[56] References Cited

U.S. PATENT DOCUMENTS

| 4,077,689 | 3/1978 | Feldberg | 439/159 |
| 4,531,795 | 7/1985 | Sinclair | 439/157 |
| 4,832,610 | 5/1989 | Matsuoka | 439/159 |

*Primary Examiner*—David L. Pirlot
*Attorney, Agent, or Firm*—Nixon & Vanderhye

[57] ABSTRACT

A socket assembly includes a rectangular socket body and two ejector mechanisms. The socket body has two opposed sides, a top surface, a bottom surface, a row of terminal-receiving holes formed in the top surface on at least the two opposed sides for receiving terminal pins of an integrated circuit chip therein, and a plurality of terminal pins extending from the bottom surface and corresponding to the terminal-receiving holes. Each of the ejector mechanisms includes an elongated pivot plate. Each of the pivot plates has a lower end mounted pivotally on a corresponding one of the two opposed sides of the socket body and further has a levering rib extending transversely from an inner surface thereof and extending normally above the top surface. The levering rib has a longitudinal distal edge which is formed with a row of terminal-receiving notches aligned with a corresponding one of the rows of terminal-receiving holes in the socket body.

3 Claims, 3 Drawing Sheets

SOCKET ASSEMBLY FOR AN INTEGRATED CIRCUIT CHIP

BACKGROUND OF THE INVENTION

1. Field Of The Invention

This invention relates to a socket assembly for an integrated circuit chip, more particularly to a socket assembly which is constructed to facilitate extraction of an integrated circuit chip therefrom.

2. Description Of The Related Art

Pins of an integrated circuit chip, such as those of a central processing unit (CPU), are easily deformed when the integrated circuit chip is extracted from a conventional socket. It is a pity to discard an integrated circuit chip having deformed pins even though the integrated circuit chip is operable.

SUMMARY OF THE INVENTION

Therefore, the main object of the present invention is to provide a socket assembly for an integrated circuit chip which can facilitate the extraction of the integrated circuit chip therefrom.

According to the present invention, a socket assembly includes a rectangular socket body and two ejector mechanisms. The socket body has two opposed sides, a top surface, a bottom surface, a row of terminal-receiving holes formed in the top surface on at least the two opposed sides for receiving terminal pins of an integrated circuit chip therein, and a plurality of terminal pins extending from the bottom surface and corresponding to the terminal-receiving holes. Each of the ejector mechanisms includes an elongated pivot plate. Each of the pivot plates has a lower end mounted pivotally on a corresponding one of the two opposed sides of the socket body and further has a levering rib extending transversely from an inner surface thereof and extending normally above the top surface. The levering rib has a longitudinal distal edge which is formed with a row of terminal-receiving notches aligned with a corresponding one of the rows of terminal-receiving holes in the socket body.

BRIEF DESCRIPTION OF THE DRAWINGS

Other features and advantages of the present invention will become apparent in the following detailed description of the preferred embodiment, with reference to the accompanying drawings, of which.

DETAILED DESCRIPTION OF THE PREFERRED EMBODIMENT

Figure 1:
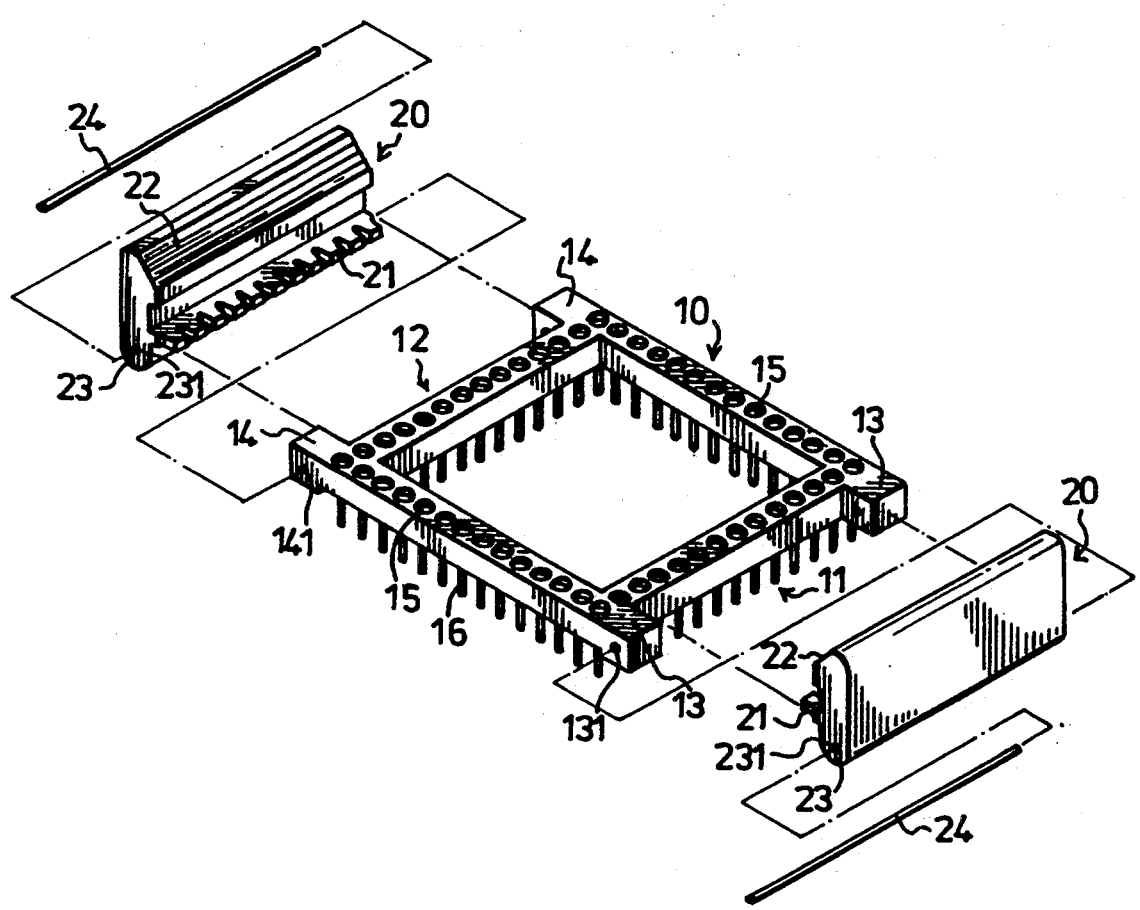
FIG. 1 is an exploded view of a socket assembly according to the present invention.
Figure 2:
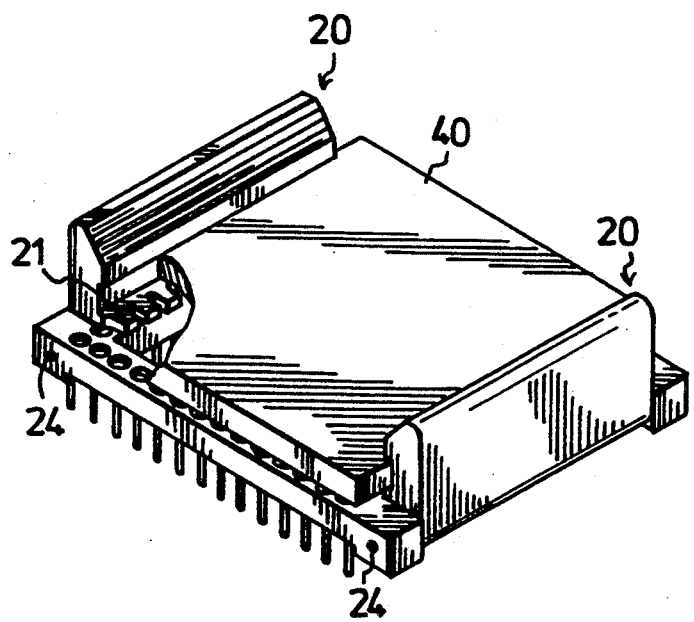
FIG. 2 is an perspective view of the socket assembly according to the present invention, wherein a central processing unit is mounted on the socket assembly.
Figure 3:
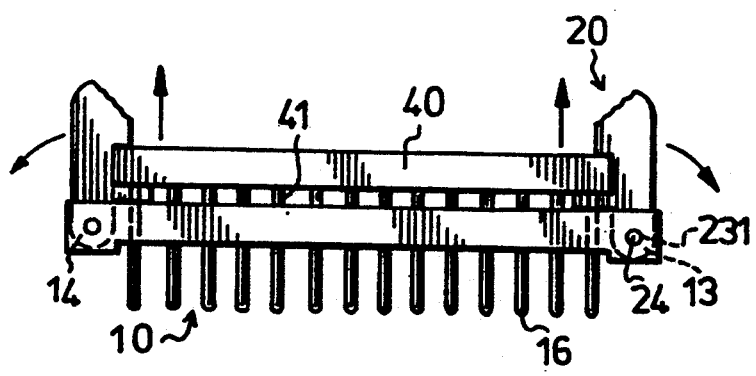
FIG. 3 is a schematic view of the socket assembly according to the present invention.

Referring to FIGS. 1, 2 and 3, a socket assembly for an integrated circuit chip according to this invention includes a rectangular socket body 10 and two ejector mechanisms 20.

The socket body 10 has two opposed sides 11,12, a top surface, a bottom surface and four rows of terminal-receiving holes 15 formed in the top surface for receiving terminal pins 41 of an integrated circuit chip 40 therein. Each two adjacent rows of terminal-receiving holes 15 are perpendicular to one another. The socket body 10 further has a plurality of terminal pins 16 extending from the bottom surface and corresponding to the terminal-receiving holes 15. The terminal pins 16 are adapted to be connected to an electrical component, such as a printed circuit board (not shown). Each of the opposed sides 11,12 of the socket body 10 has two spaced apart lug members 13,14 which extend therefrom and which are formed with aligned pin holes 131,141 therethrough.

Each of the ejector mechanisms 20 includes an elongated pivot plate and a pivot pin 24. Each of the pivot plates has a lower end 23 which is disposed between the lug members 13,14 on a corresponding one of the two opposed sides 11,12 and which has a pin passage 231 formed longitudinally therethrough and aligned with the pin holes 131,141. Each of the pivot plates is mounted pivotally on the corresponding side 11,12 of the socket body 10 at the lower end 23 by extending the pivot pin 24 through the pin passage 231 of the pivot plate and the aligned pin holes 131,141 of the lug member 13,14 on the corresponding side 11,12 of the socket body 10. Each of the elongated pivot plates further has a levering rib 21 which extends transversely from an inner surface thereof and which extends normally above the top surface of the socket body 10, and a top portion formed with a knurled inner surface 22 to provide a firm grip and minimize slipping when operating the pivot plates. Each of the levering ribs 21 has a longitudinal distal edge formed with a row of terminal-receiving notches aligned with a corresponding one of the rows of terminal-receiving holes 15 in the socket body 10.

Figure 4:
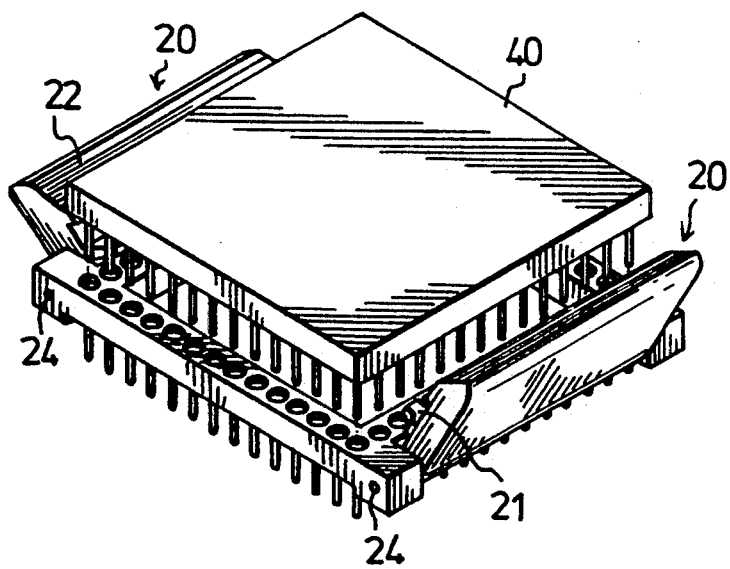
FIG. 4 is a perspective view of the socket assembly shown in FIG. 2, wherein the ejector mechanisms of the socket assembly are operated to extract the CPU from the socket assembly.
Figure 5:
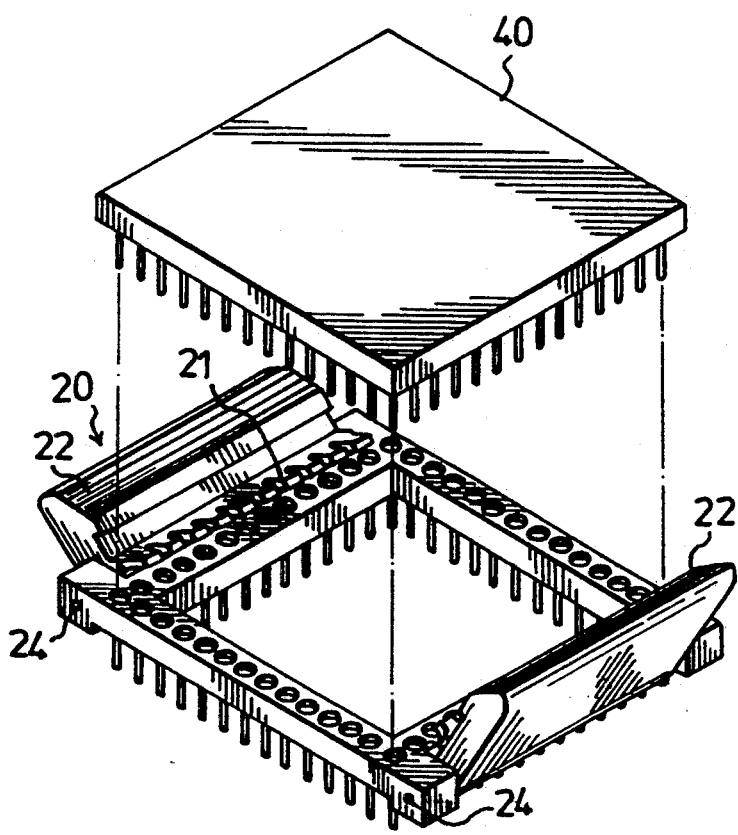
FIG. 5 is a perspective view of the socket assembly shown in FIG. 2, wherein the CPU is completely extracted from the socket assembly.

In use, the pins 41 of the integrated circuit chip 40, such as a central processing unit (CPU), are inserted into the terminal-receiving holes 15 of the socket body 10, as shown in FIGS. 2 and 3. The levering ribs 21 of the pivot plates are interposed between the integrated circuit chip 40 and the socket body 10 at this stage. When the pivot plates are operated manually to pivot away from each other, the pins 41 of the integrated circuit chip 40 are extracted from the terminal-receiving holes 15 of the socket body 10, as shown in FIG. 4. FIG. 5 shows the pivot plates after the pins 41 of the integrated circuit chip 40 are extracted completely from the terminal-receiving holes 15 of the socket body 10.

In the present embodiment, each of the ejector mechanisms 20 can be made of plastic and can be formed by mold ejection, thereby lowering the cost of manufacture of the socket assembly of the present invention.

While the present invention has been described in connection with what is considered the most practical and preferred embodiment, it is understood that this invention is not limited to the disclosed embodiment, but is intended to cover various arrangements included within the spirit and scope of the broadest interpretation so as to encompass all such modifications and equivalent arrangements.

I claim:

1. A socket assembly for an integrated circuit chip, said socket assembly including a rectangular socket body having two opposed sides, a top surface, a bottom surface, a row of terminal-receiving holes formed in said top surface on at least said two opposed sides for receiving terminal pins of said integrated circuit chip therein, and a plurality of terminal pins extending from said bottom surface and corresponding to said terminal-receiving holes, said socket assembly further comprising two ejector mechanisms, each of said ejector mechanisms including an elongated pivot plate, each of said pivot plates having a lower end mounted pivotally on a corresponding one of said two opposed sides of said socket body and further having a levering rib extending transversely from an inner surface thereof and extending normally above said top surface, said levering rib having a longitudinal distal edge formed with a row of terminal-receiving notches aligned with a corresponding one of said rows of terminal-receiving holes in said socket body.

2. A socket assembly for an integrated circuit chip as claimed in Claim 1, wherein each of said opposed sides of said socket body has two spaced apart lug members which extend therefrom and which are formed with aligned pin holes therethrough, said lower end of each of said elongated pivot plates being disposed between said lug members on the corresponding one of said two opposed sides and having a pin passage formed longitudinally therethrough and aligned with said pin holes, each of said ejector mechanisms further including a pivot pin extending through said pin passage of said pivot plate and said aligned pin holes of said lug members on the corresponding one of said opposed sides of said socket body.

3. A socket assembly for an integrated circuit chip as claimed in Claim 2, wherein each of said elongated pivot plates has a top portion formed with a knurled inner surface.

* * * * *